(12) United States Patent
Li

(10) Patent No.: US 8,030,993 B2
(45) Date of Patent: Oct. 4, 2011

(54) GAIN CONTROL CIRCUIT AND METHOD OF GAIN CONTROL

(75) Inventor: Liang-Hui Li, Tainan (TW)

(73) Assignee: Realtek Semiconductor Corp., Hsinchu (TW)

( * ) Notice: Subject to any disclaimer, the term of this patent is extended or adjusted under 35 U.S.C. 154(b) by 32 days.

(21) Appl. No.: 12/685,956

(22) Filed: Jan. 12, 2010

(65) Prior Publication Data

US 2010/0176862 A1 Jul. 15, 2010

(30) Foreign Application Priority Data

Jan. 13, 2009 (TW) .............................. 98101090 A

(51) Int. Cl.
*G06G 7/12* (2006.01)
(52) U.S. Cl. ........ 327/560; 327/561; 330/271; 330/278; 455/234.1; 375/345
(58) Field of Classification Search .................. 327/560, 327/561; 330/271, 278; 455/234.1; 375/345
See application file for complete search history.

(56) References Cited

U.S. PATENT DOCUMENTS

| | | | | |
|---|---|---|---|---|
| 4,225,976 A * | 9/1980 | Osborne et al. | ............ | 455/226.3 |
| 4,546,326 A * | 10/1985 | Van Uffelen et al. | ......... | 330/129 |
| 5,841,820 A * | 11/1998 | Krishnamurthy et al. | .... | 375/345 |
| 7,221,226 B2 * | 5/2007 | Ogura | ........................... | 330/281 |
| 7,504,884 B2 * | 3/2009 | Ra et al. | ........................ | 330/279 |
| 7,734,267 B2 * | 6/2010 | Wagner | ...................... | 455/240.1 |
| 7,782,138 B2 * | 8/2010 | Dally et al. | .................. | 330/279 |

* cited by examiner

*Primary Examiner* — Kenneth B. Wells
(74) *Attorney, Agent, or Firm* — Thomas, Kayden, Horstemeyer & Risley, LLP

(57) ABSTRACT

The present invention relates to a gain control circuit, which detects an output signal of a front-end circuit to produce a detection signal. An operation unit performs an accumulation operation to the detection signal and thereby produces an operation signal. In addition, the operation unit also resets the operation unit according to a reset signal. A reset unit produces the reset signal for every predetermined interval of time. A control unit produces a control signal according to the operation signal and a first threshold value for controlling an output gain of the front-end circuit.

28 Claims, 7 Drawing Sheets

GAIN CONTROL CIRCUIT AND METHOD OF GAIN CONTROL

FIELD OF THE INVENTION

The present invention relates to a gain control circuit, and particularly to an automatic gain control circuit.

BACKGROUND OF THE INVENTION

In a wireless communication network, because wireless signal strength varies significantly depending on climate, location, distances between devices, obstacles therebetween, or the position of antennas. Thereby, when a signal arrives at the receiver, its signal strength cannot be predicted in advance. Hence, a wireless receiver needs an automatic gain controller (AGC) to make the signal received by the demodulator fall within an allowable range, and thus the receiver can operate normally.

There are two types of devices used for controlling gains: one is the variable gain amplifier (VGA), and the other is the programmable gain amplifier (PGA). According to device characteristics, the latter is easier to be implemented using a silicon tuner than the former is. However, the latter is less suitable for applications with continuous data transmission, such as a television system. Thereby, how to extend applications of a programmable gain amplifier has become a problem to be solved.

SUMMARY

An objective of the present invention is to provide a gain control circuit and a method of gain control for solving the problems described above.

Another objective of the present invention is to provide a gain control circuit and a method of gain control for controlling gain of the output signals of a front-end circuit.

Still another objective of the present invention is to provide a gain control circuit and a method of gain control for enhancing stability of television signals.

The gain control circuit according to the present invention comprises a detection unit, an operation unit, a reset unit, and a control unit. The detection unit detects an output signal of a front-end circuit to produce a detection signal and to transmit the detection signal to the operation unit, which performs an accumulation operation to the detection signal and thereby produces an operation signal. In addition, the operation unit also resets the operation unit according to a reset signal. The control unit produces a control signal according to the operation signal and a first threshold value for controlling an output gain of the front-end circuit. Besides, the reset unit produces the reset signal for every predetermined interval of time.

The method of gain control according to the present invention comprises steps as follows: detecting an output signal of a front-end circuit to produce a detection signal; performing accumulation operation to the detection signal to produce an operation signal; producing a reset signal for every predetermined interval of time, and re-accumulating the detection signal according to the reset signal; and comparing the operation signal and a first threshold value to produce a control signal for controlling an output gain of the front-end circuit.

DETAILED DESCRIPTION

In order to make the structure and characteristics as well as the effectiveness of the present invention to be further understood and recognized, the detailed description of the present invention is provided as follows along with preferred embodiments and accompanying figures.

Figure 1:
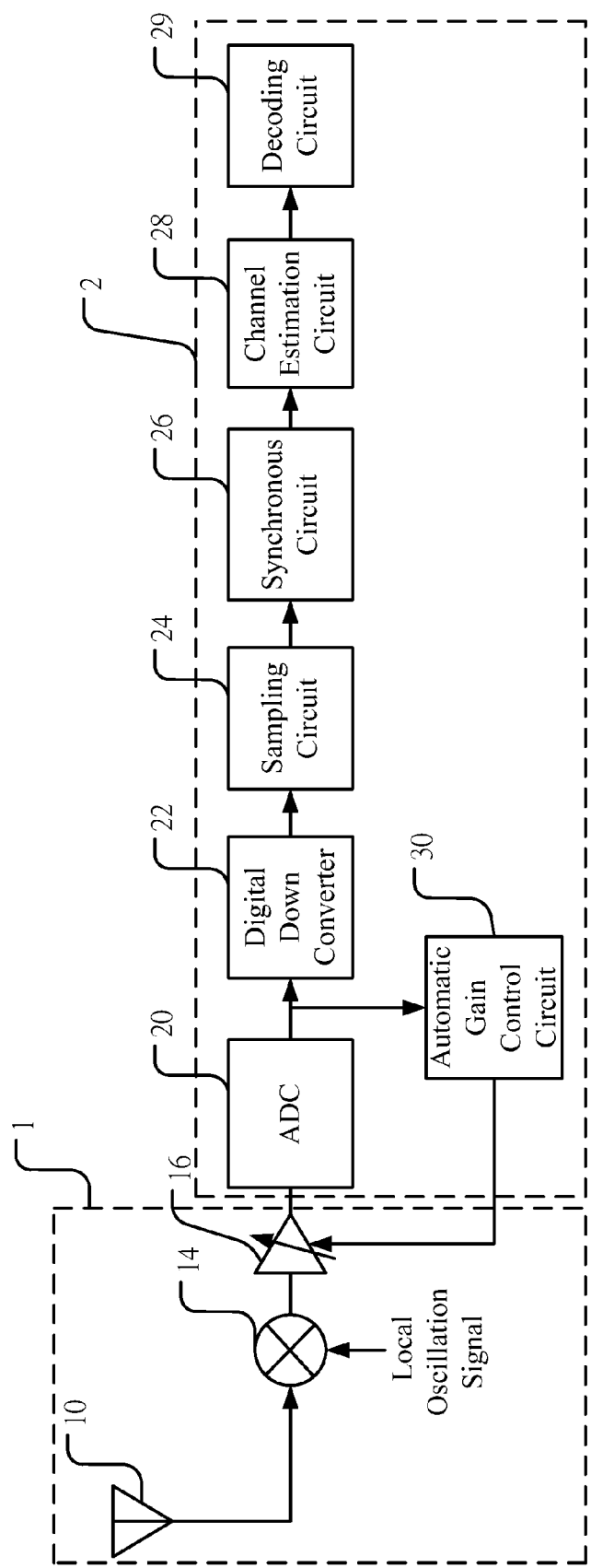
FIG. 1 shows a block diagram of a wireless receiver according to the present invention.

FIG. 1 shows a block diagram of a wireless receiver according to the present invention. As shown in the figure, the wireless receiver includes a tuner 1 and a demodulation circuit 2. The tuner 1 includes a receiving antenna 10, a mixer 14, and a programmable gain amplifier (PGA) 16. The receiving antenna 10 is used for receiving an input signal and producing a received signal, which is then transmitted to the mixer 14. The mixer 14 mixes the received signal and a local oscillation signal to produce a mixed signal, which is an analog signal. The PGA 16 receives the mixed signal, and amplifies the mixed signal according to a gain coefficient. The amplified mixed signal is then transmitted to the demodulation circuit 2.

The demodulation circuit 2 includes an analog-to-digital (A/D) converter 20, a digital down-converter 22, a sampling circuit 24, a synchronous circuit 26, a channel estimation circuit 28, a decoding circuit 29, and a gain control circuit 30. The A/D converter 20 receives the mixed signal, and converts it to a first digital signal, which can be a mid-frequency signal. Next, the digital down-converter 22 down converts the first digital signal and produces a second digital signal, which can be a baseband signal. The sampling circuit 24 samples the second digital signal and produces a sampling signal. Then the synchronous circuit 26 synchronizes the sampling signal and produces a synchronized sampling signal, which is transmitted to the channel estimation circuit 28 for producing an estimation signal. In an embodiment, the synchronous circuit 26 can synchronize the sampling signal according to a PN sequence. The decoding circuit 29 receives the estimation signal and produces a decoded signal for backend circuits.

The gain control circuit 30 receives and analyzes the first digital signal, and produces an analysis result. An output gain of the front-end circuit is controlled according to the analysis result. Namely, the gain control circuit 30 controls the gain of the PGA 16 in the tuner 1 according to the analysis result, and the strength of the output signal of the tuner 1 is controlled accordingly.

Figure 2:
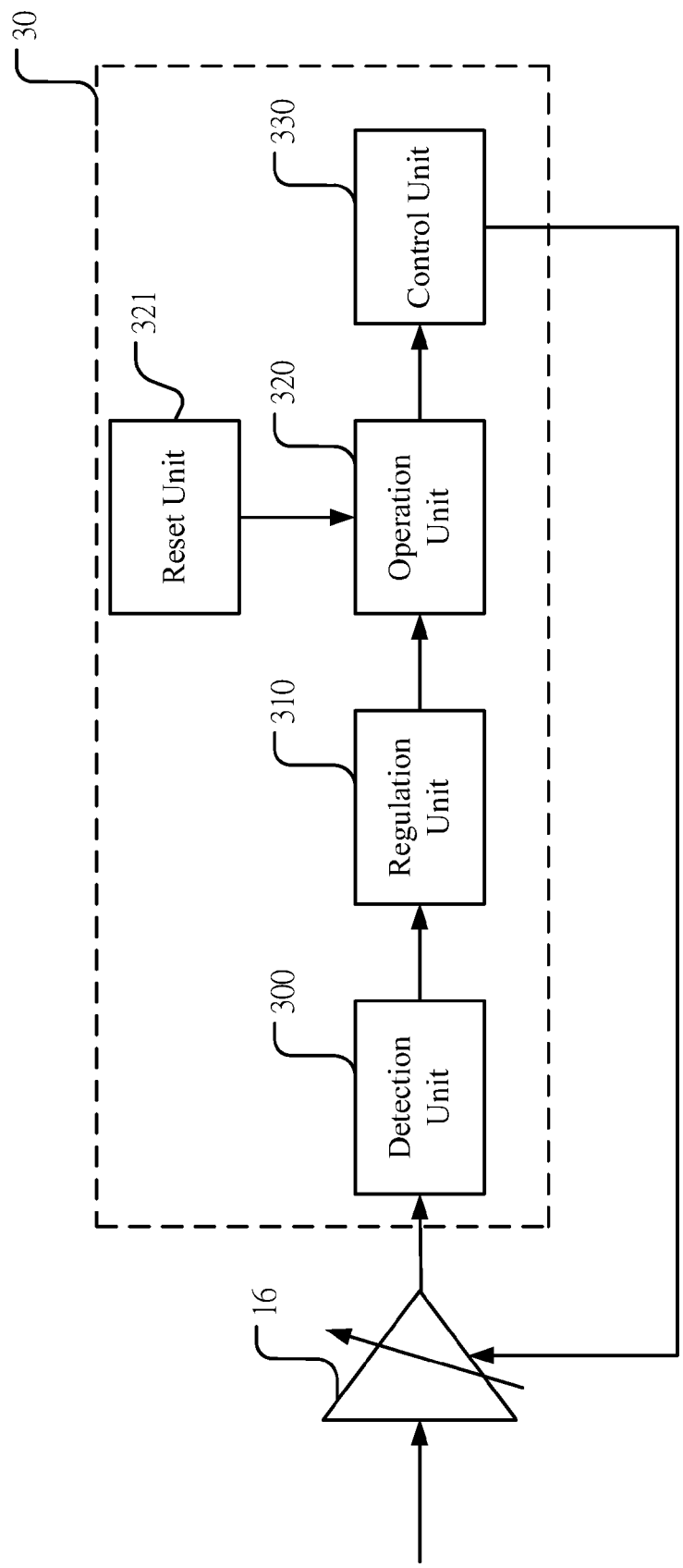
FIG. 2 shows a block diagram of a gain control circuit according to a preferred embodiment of the present invention.
Figure 3A:
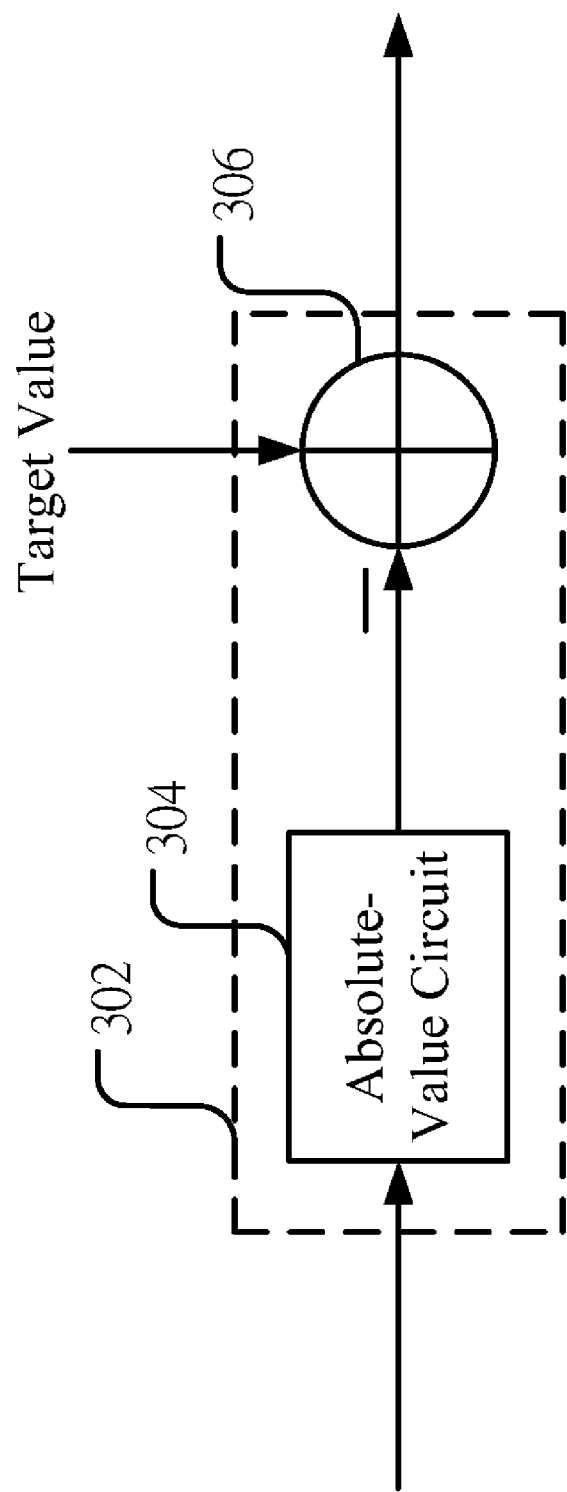
FIG. 3A shows a block diagram of a detection unit according to a preferred embodiment of the present invention.

FIG. 2 shows a block diagram of a gain control circuit according to a preferred embodiment of the present invention. As shown in the figure, the gain control circuit 30 according to the present invention includes a detection unit 300, a regulation unit 310, an operation unit 320, and a control unit 330. The detection unit 300 receives and detects the first digital signal and produces a detection signal, wherein the detection unit 300 can be an error detection unit and detecting the error between the first digital signal and a target value. FIG. 3A shows a block diagram of a detection unit according to a preferred embodiment of the present invention. As shown in the figure, the detection unit 300 includes an operation circuit 302, which detects the error between the first digital signal and the target value, and thereby produces the detection signal. The target value can be a predetermined value. In addition, the operation circuit 302 includes an absolute-value circuit 304 and a subtractor 306. The absolute-value circuit 304 receives the first digital signal, and performs the absolute-value operation on the first digital signal for producing the absolute value thereof. The subtractor 306 receives the absolute value of the first digital signal and subtracts the absolute value of the first digital signal from the target value to produce the detection signal.

Figure 3B:
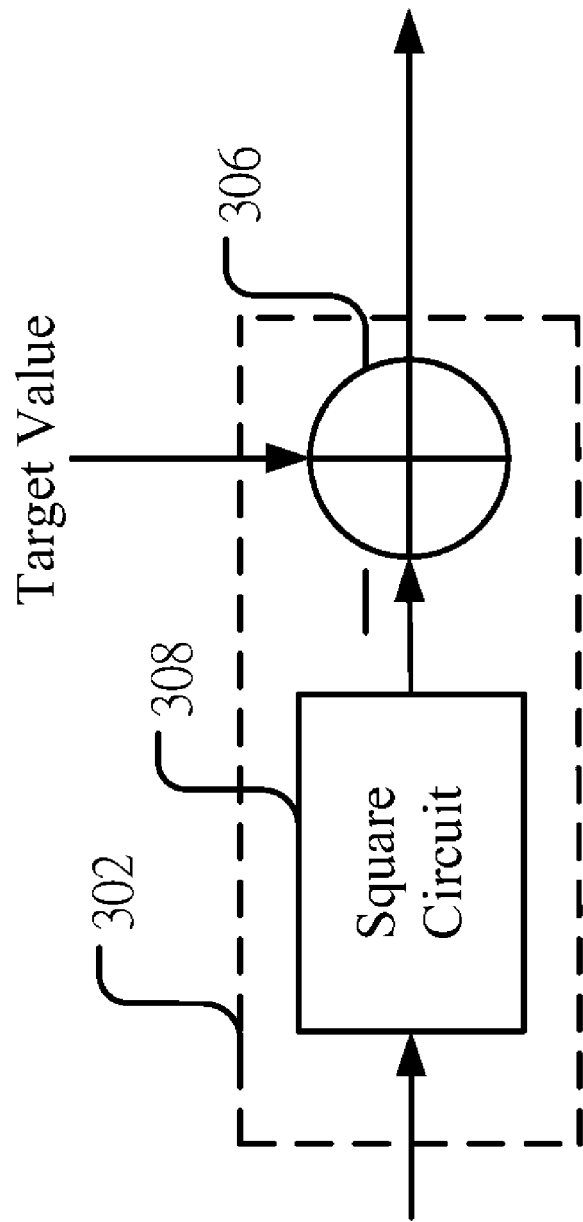
FIG. 3B shows a block diagram of a detection unit according to another preferred embodiment of the present invention.

However, the error value according to the present method might be not notable enough. Therefore, a square circuit 308 can be adopted. FIG. 3B shows a block diagram of a detection unit according to another embodiment of the present invention. In this embodiment, the operation circuit 302 comprises a square circuit 308 and a subtractor 306. The square circuit 308 receives and squares the first digital signal to produce the square value of the first digital signal. Then the square value of the first digital signal is subtracted from the target value to produce the detection signal.

Referring to FIG. 2 again, after the detection signal is received by the operation unit 320, the operation unit 320 performs an accumulation operation on the detection signal and produces an operation signal. Meanwhile, the operation unit 320 is reset according to a reset signal. The reset signal is produced by a reset unit 321 for every predetermined interval of time. The control unit 330 receives the operation signal, compares the operation signal with a threshold value, and produces a control signal for controlling an output gain of the tuner 1, namely, controlling the gain of the PGA 16. Thereby, the strength of the output signal of the tuner 1 is controlled accordingly. The operation unit 320 might be an integrator, performing an integration operation on the detection signal and producing the operation signal.

Figure 5:
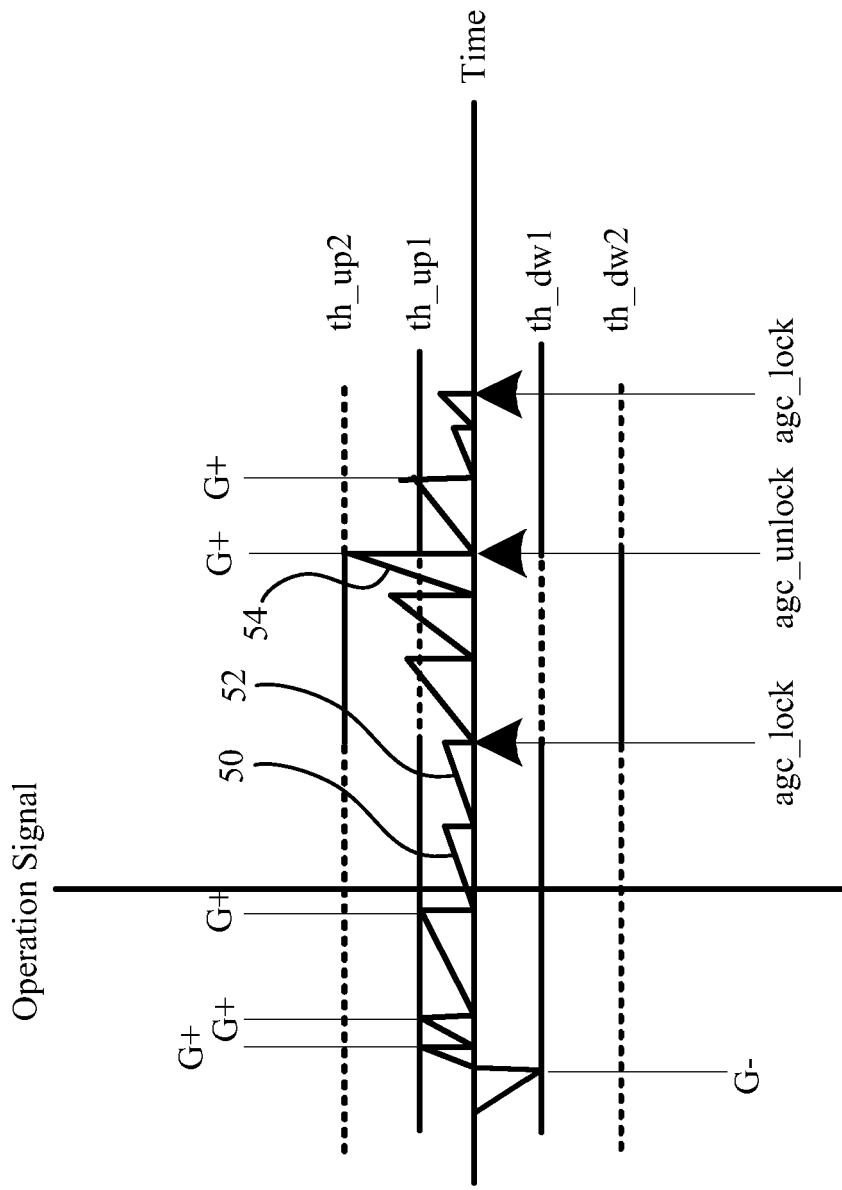
FIG. 5 shows an output waveform of an operation unit according to a preferred embodiment of the present invention.

When the control unit 330 produces the control signal to modulate the output gain of the tuner 1, the operation unit 320 is reset. In an embodiment, the threshold value comprises a first positive threshold value and a first negative threshold value. When the control unit 330 confirms that the operation signal is greater than the first positive threshold value th_up1 (as shown in FIG. 5), the control signal is produced for driving the PGA 16 to increase the output gain, that is, to increase the output signal of the tuner 1. At the same time, the operation unit 320 is reset for driving the operation unit to re-perform the accumulation operation. Likewise, when the control unit 330 confirms that the operation signal is less than the first negative threshold value th_dw1 (as shown in FIG. 5), the control signal is produced for decreasing the output gain and resetting the operation unit 320. Furthermore, within a predetermined interval of time, if the operation signal is not greater than the first positive threshold value th_up1 or is not less than the first negative threshold value th_dw1, the operation unit 320 is still reset (as the operation signal 50 shown in FIG. 5). In addition, the reset unit 321 according to the present invention can be set inside of the operation unit 320 or inside of the control unit 330, not limited to be set outside of the operation unit 320.

Figure 4A:
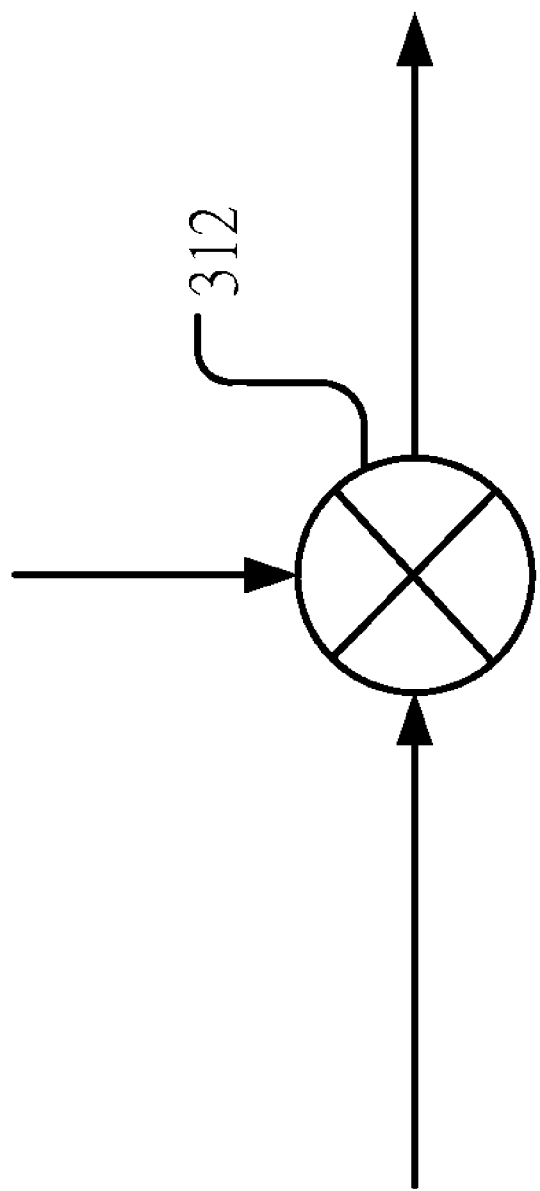
FIG. 4A shows a block diagram of a regulation unit according to a preferred embodiment of the present invention.

Beside, the gain control circuit according to the present invention further includes a regulation unit 310 coupled between the detection unit 300 and the operation unit 320. The regulation unit 310 receives and regulates the detection signal, which means scaling the strength of the detection signal for controlling the convergence time and stability of the gain control circuit 30. FIG. 4A shows a block diagram of a regulation unit according to a preferred embodiment of the present invention. As shown in the figure, the regulation unit 310 according to the present invention includes a multiplier 312, which receives the detection signal, and regulates the detection signal by multiplying the detection signal by a ratio factor. The ratio factor determines the scaling strength of the detection signal.

Figure 4B:
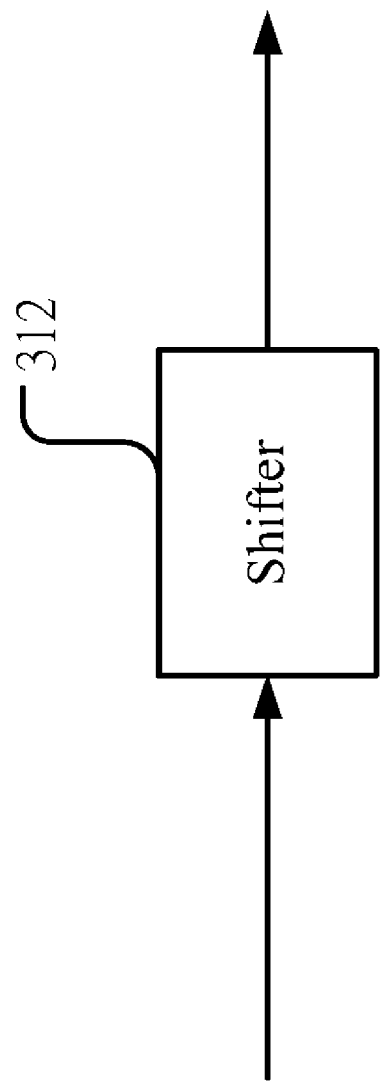
FIG. 4B shows a block diagram of a regulation unit according to another preferred embodiment of the present invention.

FIG. 4B shows a block diagram of a regulation unit according to another preferred embodiment of the present invention. As shown in the figure, the regulation unit 310 according to the present invention includes a shifter 314, which receives and shifts the detection signal for regulating the detection signal. The shifter 314 determines the scaling strength of the detection signal by the amount of bits of the detection signal shifted.

FIG. 5 shows an output waveform of an operation unit according to a preferred embodiment of the present invention. As shown in the figure, the control unit 330 according to the present invention produces the control signal according to the operation signal output by the operation unit 320. The reset unit 321 further includes a counter (not shown in the figure) for counting the number of times for which the operation unit 320 performs the accumulation operations. In addition, when the number of times of the accumulation operations is greater than a reference value, the operation unit 320 is reset. Furthermore, two threshold values are set for the control unit 330 including the first positive threshold value th_up1 and the first negative threshold value th_dw1, respectively. When the operation signal output by the operation unit 320 exceeds said two threshold values, the control signal is produced to drive the tuner 1 to regulate its output gain. That is, if the operation signal is greater than the first positive threshold value th_up1, the output gain of the tuner 1 is increased to amplify the output signal of the tuner 1, namely, increasing the output gain of the tuner 1 (as "G+" shown in FIG. 5). If the operation signal is less than the first negative threshold value th_dw1, the output gain of the tuner 1 is decreased to reduce the output signal of the tuner 1, namely, decreasing the output gain of the tuner 1 (as "G−" shown in FIG. 5). At this time, once the control signal produced by the control unit drives the tuner 1 to change its output gain, the operation unit 320 is reset. Thereby, the gain control circuit 30 can control the gain of the output signal of the tuner 1.

Besides, the gain control circuit 30 according to the present invention can be applied to a television system. In a television system, during the transient of tuning the gain, noises in the television signals are very likely to occur. In a preferred embodiment, the interference phenomenon is called a mosaic appearance. Thereby, once the gain is stabilized, it is recommended not to vary the gain control circuit 30 at liberty. Hence, the control unit 330 of the gain control circuit 30 according to the present invention further sets a second positive threshold value th_up2 and a second negative threshold value th_dw2, where the second positive threshold value th_up2 is greater than the first positive threshold value th_up1, and the second negative threshold value th_dw2 is less than the first negative threshold value th_dw1. Moreover, a lock value (agc) is set inside of the control unit 330 for representing that the tuner 1 has locked the output gain.

Referring again to FIG. 5, the slope of the operation signal in the figure corresponds to the error value between the first digital signal and the target value. In a preferred embodiment, the correspondence is proportional, which means the larger the error value, the steeper the slope. In addition, the control unit 330 judges according to the operation signal output by the operation unit 320. When the operation signal is greater than the first positive threshold value th_up1 and the lock value is logic "0" (as "agc_unlock" shown in FIG. 5), the output gain of the tuner 1 is increased. At the same time, the operation unit 320 is reset for driving the operation unit 320 to re-perform the accumulation operation. On the other hand, when the operation signal is less than the first negative threshold value th_dw1 and the lock value is logic "0", the output gain of the tuner 1 is decreased. At the same time, the operation unit 320 is reset and the lock value is set for driving the operation unit 320 to re-perform the accumulation operation. Besides, for every predetermined interval of time or when the number of times of the accumulation operations performed by the operation unit 320 exceeds the reference value (in a preferred embodiment, 1~3), even if the operation signal is not greater than the first positive threshold value th_up1 or is not less than the first negative threshold value (as the operation signal 52 shown in FIG. 5), the operation unit 320 is still reset and the lock value is set to logic "1" (as "agc_lock" shown in FIG. 5).

Furthermore, the control unit 330 can produce the control signal according to the first positive threshold value th_up1, the first negative threshold value th_dw1, the second positive threshold value th_up2, the second negative threshold value th_dw2, and the lock value for controlling the output gain of the tuner 1. That is, when the operation unit 320 has reset once one or more times and the operation signal is less than the absolute value of the first positive threshold value th_up1, the control unit 330 produces the control signal for locking the output gain of the front-end circuit, namely, setting the lock value to logic "1". (This is used as an example for description, not for limiting the present invention. The lock value can be set as logic "0" when the output gain of the front-end circuit is locked.) That is to say, when the lock value is logic "1", only when the operation signal is greater than the second positive threshold value th_up2 can the control unit 330 increase the output gain of the front-end circuit. Thereby, when the gain is stabilized, the gain control circuit 30 will not change at liberty, hence increasing the stability of television signals. Meanwhile, the operation unit 320 is reset for driving the operation unit 320 to re-perform the accumulation operation, and setting the lock value to logic "0" (as the operation signal 54 shown in FIG. 5). Likewise, when the operation signal is less than the second negative threshold value th_dw2 and the lock value is logic "1", the output gain of the tuner is decreased. At the same time, the operation unit 320 is reset for driving the operation unit 320 to re-perform the accumulation operation, and setting the lock value to logic "0". For every predetermined interval of time or when the number of times of the accumulation operations performed by the operation unit 320 exceeds the reference value (in a preferred embodiment, 1~3), even if the operation signal is not greater than the first positive threshold value th_up1 or is not less than the first negative threshold value, the operation unit 320 is still reset and the lock value is set to logic "1". The regulation described above is repeated for giving the most appropriate output gain of the tuner 1.

To sum up, the method for controlling the gain control circuit includes detecting an output signal of a tuner by a detection unit, producing a detection signal and transmitting the detection signal to the operation unit for operating and producing an operation signal, comparing the operation signal and a threshold value by the control unit, and hence controlling an output gain of the front-end circuit. Thereby, according to the present invention, the gain of the output signal of the front-end circuit can be controlled automatically.

Accordingly, the present invention conforms to the legal requirements owing to its novelty, non-obviousness, and utility. However, the foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. A gain control circuit, comprising:
    a detection unit for detecting an output signal of a front-end circuit and producing a detection signal;
    a regulation unit for receiving the detection signal and regulating the detection signal according to a ratio factor;
    an operation unit for receiving the detection signal outputted from the regulation unit and performing an accumulation operation to the detection signal to produce an operation signal and resetting the operation unit according to a reset signal;
    a reset unit used for producing the reset signal for every predetermined interval of time; and
    a control unit for producing a control signal according to the operation signal and a first threshold value for controlling an output gain of the front-end circuit.

2. The gain control circuit of claim 1, wherein the operation unit is an integrator, and the accumulation operation is an integration operation.

3. The gain control circuit of claim 1, wherein the reset unit includes a counter.

4. The gain control circuit of claim 1, wherein the control unit confirms that the operation signal is greater than the first threshold value and produces the control signal for increasing the output gain, and that the operation signal is less than the first threshold value and produces the control signal for decreasing the output gain.

5. The gain control circuit of claim 1, wherein when the operation unit resets one or more times and the operation signal is greater than an absolute value of the first threshold value, the control unit produces the control signal according to the operation signal and a second threshold value.

6. The gain control circuit of claim 5, wherein the control unit confirms that the operation signal is greater than the second threshold value and produces the control signal for increasing the output gain.

7. The gain control circuit of claim 5, wherein the control unit confirms that the operation signal is less than the second threshold value and produces the control signal for decreasing the output gain.

8. The gain control circuit of claim 1, wherein when the operation unit resets one or more times and the operation signal is less than an absolute value of the first threshold value, the control unit produces the control signal for locking the output gain of the front-end circuit.

9. The gain control circuit of claim 1, wherein the front-end circuit includes a programmable gain amplifier for controlling the output gain of the front-end circuit according to the control signal, and controlling the strength of the output signal according to the output gain.

10. The gain control circuit of claim 1, wherein the detection unit is an error detection unit.

11. The gain control circuit of claim 1, wherein the detection unit includes an operation circuit for operating on the output signal of the front-end circuit and a target value, and producing the detection signal.

12. The gain control circuit of claim 11, wherein the operation circuit includes:
    an absolute-value circuit for receiving the output signal and producing an absolute value of the output signal; and a subtractor for subtracting the absolute value from the target value and producing the detection signal.

13. The gain control circuit of claim 11, wherein the operation circuit includes:
a square circuit for receiving and squaring the output signal and producing a square value of the output signal; and
a subtractor for subtracting the square value from the target value and producing the detection signal.

14. The gain control circuit of claim 1, wherein the regulation unit includes a multiplier for receiving the detection signal and multiplying the detection signal and the ratio factor for regulating the detection signal.

15. The gain control circuit of claim 1, wherein the regulation unit includes a shifter for receiving and shifting the detection signal for regulating the detection signal.

16. The gain control circuit of claim 1, wherein television system comprises the front-end circuit.

17. A method of gain control, comprising steps of:
detecting an output signal of a front-end circuit to produce a detection signal;
multiplying the detection signal by a ratio factor for regulating the detection signal;
performing an accumulation operation on the detection signal to produce an operation signal;
producing a reset signal for every predetermined interval of time and re-accumulating the detection signal according to the reset signal; and
comparing the operation signal and a first threshold value to produce a control signal for controlling an output gain of the front-end circuit.

18. The method of claim 17, wherein the step of performing accumulation operation on the detection signal to produce the operation signal is performing integration operation to the detection signal to produce the operation signal.

19. The method of claim 17, wherein in the step of comparing the operation signal and the first threshold value, when the operation signal is greater than the first threshold value, the control signal is produced for increasing the output gain.

20. The method of claim 17, wherein in the step of comparing the operation signal and the first threshold value, when the operation signal is less than the first threshold value, the control signal is produced for decreasing the output gain.

21. The method of claim 17, wherein when re-accumulating the detection signal one or more times and the operation signal being greater than an absolute value of the first threshold value, the control signal is produced according to the operation signal and a second threshold value.

22. The method of claim 21, wherein when the operation signal is greater than the second threshold value, the control signal is produced for increasing the output gain.

23. The method of claim 21, wherein when the operation signal is less than the second threshold value, the control signal is produced for decreasing the output gain.

24. The method of claim 17, further comprising a step of producing the control signal for locking the output gain when re-accumulating the detection signal one or more times and the operation signal being less than an absolute value of the first threshold value.

25. The method of claim 17, further comprising a step of operating the output signal of the front-end circuit and a target value for producing the detection signal.

26. The method of claim 25, further comprising the steps of:
performing an absolute-value operation to the output signal for giving the absolute value of the output signal; and
subtracting an absolute value of the output signal from the target value and producing the detection signal.

27. The method of claim 25, further comprising steps of:
performing a square operation to the output signal for giving a square value of the output signal; and
subtracting the square value of the output signal from the target value and producing the detection signal.

28. The method of claim 17, further comprising a step of shifting the detection signal for regulating the detection signal.

* * * * *